(12) United States Patent
Katakura et al.

(10) Patent No.: US 6,798,300 B2
(45) Date of Patent: Sep. 28, 2004

(54) OSCILLATOR AND PLL CIRCUIT USING THE SAME

(75) Inventors: Masayuki Katakura, Tokyo (JP); Yoshihiro Komatsu, Tokyo (JP); Kenji Hiromoto, Tokyo (JP); Tsuyoshi Kousaka, Tokyo (JP); Ping Fai Ben Li, Scotts Valley, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 0 days.

(21) Appl. No.: 10/374,502

(22) Filed: Feb. 25, 2003

(65) Prior Publication Data

US 2003/0218511 A1 Nov. 27, 2003

Related U.S. Application Data

(60) Provisional application No. 60/359,607, filed on Feb. 25, 2002.

(51) Int. Cl.$^7$ .............................. H03B 5/20; H03B 5/24; H03L 7/099
(52) U.S. Cl. .............................. 331/57; 331/25; 331/34; 331/143; 331/177 R; 331/179

(58) Field of Search .................................. 331/8, 10, 16, 331/17, 18, 25, 34, 57, 143, 177 R, 179

(56) References Cited

U.S. PATENT DOCUMENTS 5,420,547 A * 5/1995 Kikuchi ...................... 331/57
5,872,488 A    2/1999 Lai

* cited by examiner

*Primary Examiner*—David Mis
(74) *Attorney, Agent, or Firm*—Thomas F. Lebens; Fitch, Even, Tabin & Flannery

(57) ABSTRACT

An oscillator having a modulation function capable of controlling a frequency by adding a signal to a control signal and a PLL circuit using the same, wherein the oscillator forms a ring comprised of a plurality of cascade connected delay stages controlled in delay value by an inverter or a buffer and a control signal and forming a closed loop by an inverted phase and comprises a modulation function modulating an oscillation frequency by adding a modulation signal to the control signal in a part of the plurality of delay stages.

14 Claims, 13 Drawing Sheets

OSCILLATOR AND PLL CIRCUIT USING THE SAME

This application claims the benefit of Provisional application Ser. No. 60/359,607, filed Feb. 25, 2002.

BACKGROUND OF THE INVENTION

1. Field of the Invention

The present invention relates to a variable frequency oscillator, for example, used in a phase synchronization circuit and a phase locked loop (PLL) circuit using the same.

2. Description of the Related Art

FIG. 1 is a view of an example of the general configuration of a laser beam printer.

In the laser beam printer 1, normally a raster output scanning method is adopted. A laser beam LO from a laser source 2 is scanned over a predetermined range and converged on a photosensitive drum 4 by a polygon mirror 3 rotating at a predetermined speed. This exposes a charge portion of the photosensitive drum 4 to record an electrostatic latent image on the photosensitive drum 4 which is then printed on paper.

FIG. 2 is a schematic view of the path of a laser beam as it is reflected by the polygon mirror and scans the circumference. In FIG. 2, a solid line shown by A indicates transfer of an image to a plane, while a curve shown by B indicates a constant speed scanning path, respectively.

In the laser beam printer 1, when the laser beam LO is scanned and converged as it is on the plane, that is, the photosensitive drum 4, by a polygon mirror 3 rotating at a predetermined speed, since the rotation speed of the polygon mirror is constant, the scanning speed of the beam passing through the photosensitive drum 4 and a frequency ratio for controlling dots forming one pixel on one line do not become constant and distortion is caused on the print.

In order to prevent distortion, the laser beam printer 1 in FIG. 1 is configured using an fθ lens 5 etc. on an optical path from the polygon mirror 3 to the photosensitive drum 4 and using this optical system to make the frequency ratio for controlling the scanning speed and dots of the beam converged on the photosensitive drum 4 constant.

A laser beam printer having the above configuration, however, requires fine adjustment of the laser beam beyond the precision of correction by an optical system using a fθ lens. This is achieved by precise control for finely adjusting the clock frequency in a PLL circuit generating a clock.

FIG. 3 is a block diagram of an example of the configuration of a general PLL circuit, for example, used in a clock control system of the laser source 2 of the laser beam printer 1 in FIG. 1. Also, FIG. 4A is a timing chart of a reference signal given to the PLL circuit, while FIG. 4B is a timing chart of an output clock signal of the PLL circuit.

The PLL circuit 6 is, as shown in FIG. 3, comprised of a negative feedback circuit including a phase detector (PD) 61, a loop filter (LPF) 62, a voltage-controlled oscillator (VCO) 63, and a programmable counter (PC) 64.

The phase detector 61 compares phases of a reference signal Sr and a divided signal $S_{dv}$ of the programmable counter 64 and outputs a signal S61 in accordance with the difference to the loop filter 62.

The loop filter 62 generates a control voltage $V_c$ of the VCO 63 in accordance with the signal S61 from the phase detector 61 and outputs it to the VCO 63.

The VCO 63 oscillates at a frequency in accordance with a control voltage Vc by the loop filter 62, generates a clock signal $CLK_{op}$ having a frequency of $f_{op}$, and outputs it to the laser source and programmable counter 64.

The programmable counter 64 divides the frequency $f_{op}$ of the output clock signal $CLK_{op}$ of the VCO 63 exactly by N (here, N=24) and outputs a divided signal $S_{dv}$ having a frequency of $f_{op}/N$ to the phase detector 61.

In a PLL circuit 6 having such a configuration, as shown in FIG. 4A and FIG. 4B, since a frequency $f_r$ of the reference signal $S_r$ is fixed, an output clock $CLK_{op}$ is generated in synchronization with the reference signal $S_r$ at a constant frequency $f_{op}$ as calculated by $f_{op}=Nf_r$ and supplied to the laser source 2.

However, even a laser beam printer 1 using the above PLL circuit 6 cannot prevent deviation of position of the optical system shown in FIG. 5.

Particularly, in color printing, the same positions are scanned by laser beams for the different colors, so error in the correction precision of the optical system appears directly as color deviation.

SUMMARY OF THE INVENTION

An object of the present invention is to provide an oscillator having a modulation function able to control the frequency in addition to a control signal and a PLL circuit using the same.

To attain the above object, according to a first aspect of the present invention, there is provided an oscillator for oscillating at a frequency based on a control signal, comprising a modulation means for modulating a frequency by adding a modulation signal to the control signal.

Preferably, a modulation rate of the modulation means is controlled by a ratio of an oscillation frequency to the modulation signal value.

More preferably, the modulation signal value is given digitally.

According to a second aspect of the present invention, there is provided a ring-type oscillator including a plurality of delay stages controlled in delay value by an inverter or buffer and a control signal connected in cascade and forming a closed loop by an inverted phase, comprising a modulation means for modulating an oscillation frequency by adding a modulation signal to the control signal in part of the plurality of delay stages.

Preferably, the modulation rate of the modulation means is controlled by a ratio of an oscillation frequency to the modulation signal value.

More preferably, the modulation signal value makes the control signal value 1/n and furthermore is weighted so as to have a variable range of m bits.

According to a third aspect of the present invention, there is provided a PLL circuit comprising a phase detector for comparing phases of a feedback signal of an output signal and a reference signal and outputting a signal indicating a phase difference; a loop filter for receiving an output signal of the phase detector and outputting a control signal for canceling out the phase difference; and an oscillator for oscillating at a frequency based on a control signal from the loop filter; the oscillator comprising a modulation means for modulating a frequency by adding a modulation signal to the control signal.

Preferably, in the oscillator, a second control signal is controlled by a control signal of the loop filter and the frequency is controlled by the second control signal.

According to a fourth aspect of the present invention, there is provided a PLL circuit comprising a phase detector for comparing phases of a feedback signal of an output signal and a reference signal and outputting a signal indicating a phase difference; a loop filter for receiving an output signal of the phase detector and outputting a control signal for canceling out the phase difference; and an oscillator for oscillating at a frequency based on a control signal from the loop filter; the oscillator forming a ring-type including a plurality of delay stages controlled in delay value by an inverter or buffer and a control signal connected in cascade and forming a closed loop by an inverted phase and comprising a modulation means for modulating an oscillation frequency by adding a modulation signal to the control signal in part of the plurality of delay stages.

According to the present invention, the multiplication clock synchronized with the reference synchronization signal and obtained by the PLL circuit is not modulated in frequency in its synchronization signal.

For example, the oscillator in the PLL circuit modulates the frequency by, for example, a modulation rate given as a digital value, oscillates at a modulated frequency corresponding to a control voltage $V_c$ of a loop filter, and thereby produces a clock signal having a modulated frequency. The clock signal is supplied to a light source of a raster output scanning system.

BRIEF DESCRIPTION OF THE DRAWINGS

These and other objects and features of the present invention will become clearer from the following description of a preferred embodiment given with reference to the attached drawings, in which:

FIG. 4A is a timing chart of a reference signal given to the PLL circuit in FIG. 3, while FIG. 4B is a timing chart of an output signal of the PLL circuit;

DESCRIPTION OF THE PREFERRED EMBODIMENTS

Below, an embodiment of the present invention will be explained with reference to the drawings.

Figure 6:
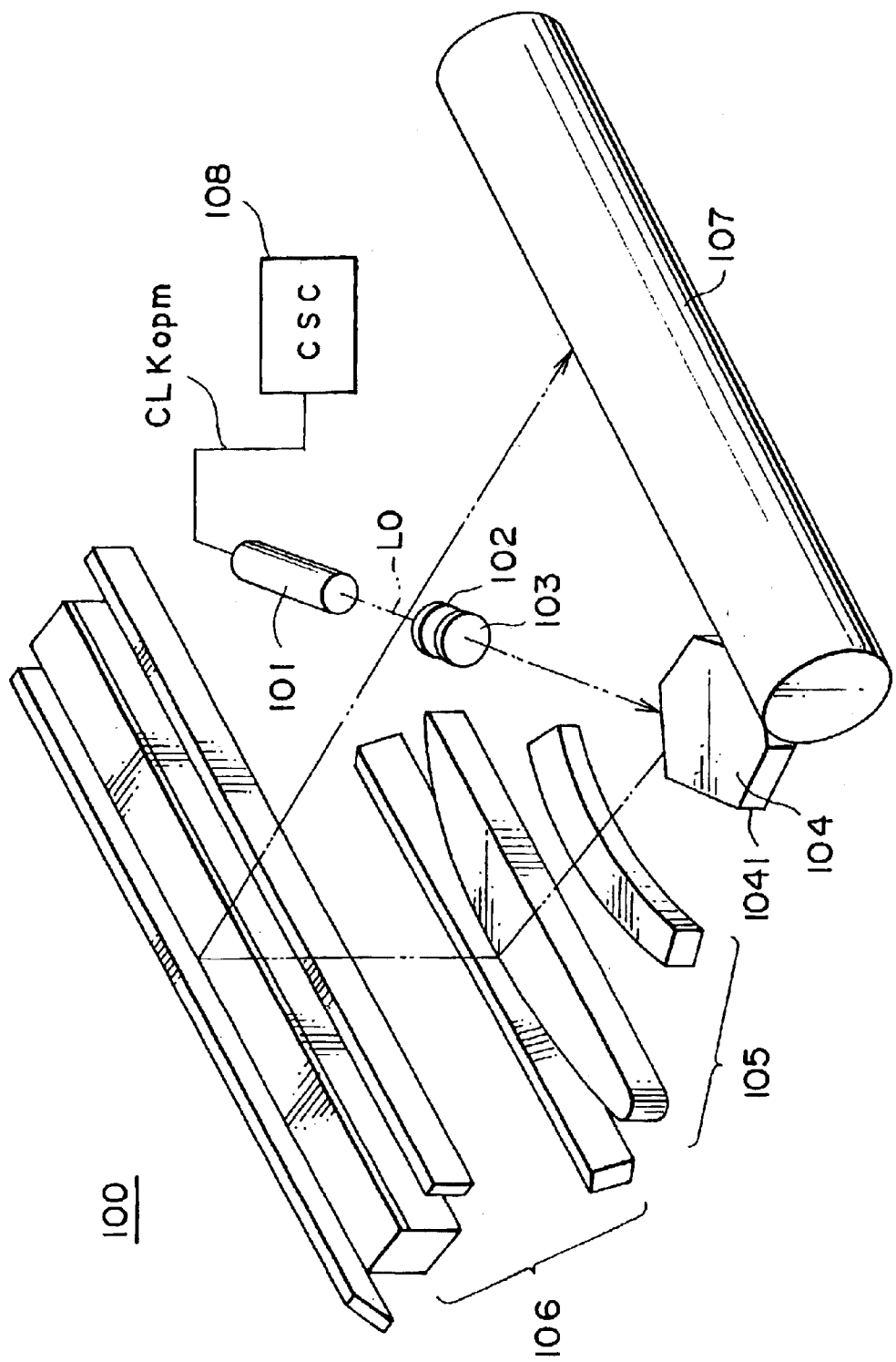
FIG. 6 is a schematic view of the basic configuration of a raster output scanning system of a laser beam printer using a PLL circuit according to the present invention.

FIG. 6 is a schematic view of the basic configuration of a raster output scanning system of a laser beam printer using a PLL circuit according to the present invention.

A laser beam printer 100 of the raster output scanning system comprises, as shown in FIG. 6, a laser source 101, a collimeter lens 102, a cylindrical lens 103, a polygon mirror 104, an fθ lens 105, a reflection optical system 106, a photosensitive drum 107, and a clock supply circuit 108.

The laser source 101 emits to the collimeter lens 102 a laser beam LO subjected to a predetermined modulation operation in synchronization with a later explained frequency modulated clock signal $CLK_{opm}$ supplied from the clock supply circuit 108.

The collimeter lens 102 converts the modulated laser beam LO emitted from the laser source 101 to parallel light and emits it to the cylindrical lens 103.

The cylindrical lens 103 focuses the laser beam converted to parallel light by the collimeter lens 102 on a light reflection facet of the polygon mirror 104.

The polygon mirror 104 rotates at a predetermined speed and comprises a plurality of light reflection facets for reflecting the laser beam from the cylindrical lens 103 to an opposite direction of an arranged position of the photosensitive drum 107.

The fθ lens 105 performs correction so that the frequency ratio for controlling the scanning speed and dots of a beam reflected by the polygon mirror 104, tracing over a predetermined optical path, and converged on the photosensitive drum 107 becomes constant and emits the beam to the reflection optical system 106.

The reflection optical system 106 reflects the laser beam emitted from the fθ lens 105 a plurality of times and focuses it over a predetermined range of the photosensitive drum 107.

The present laser beam printer 100 employs a raster scanning method, scans the laser beam LO from the laser source 101 within a predetermined range by the polygon mirror 104 rotating at a predetermined speed and the fθ lens 105, and focuses it on the photosensitive drum 107 via the reflection optical system 106. Consequently, it exposes a charged portion of the photosensitive drum 107 to record an electrostatic latent image on the photosensitive drum 107 which is then printed on paper.

The clock supply circuit 108 has a PLL circuit. The PLL circuit includes a variable frequency oscillator for controlling a frequency by a control signal and has a modulation function capable of controlling the frequency in addition to the control signal. This modulation function is controlled by the ratio of the oscillation frequency with respect to the control signal value. The circuit generates a clock signal $CLK_{opm}$ subjected to this modulation operation and supplies it to the laser source 101.

Figure 7:
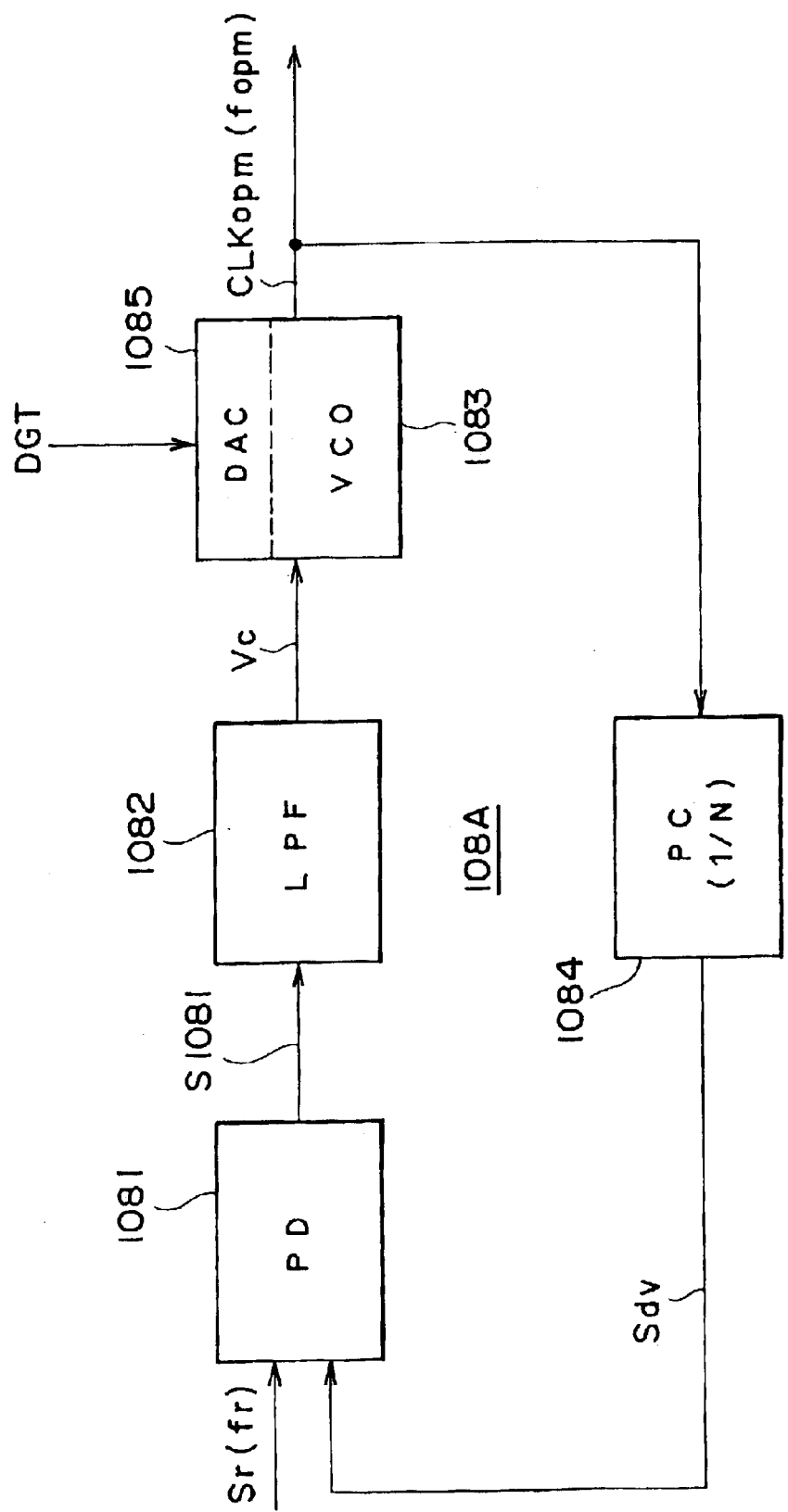
FIG. 7 is a block diagram of an example of the configuration of a PLL circuit according to the present embodiment.

FIG. 7 is a block diagram of an example of the configuration of a PLL circuit according to the present embodiment.

A PLL circuit 108A is, as shown in FIG. 7, comprised of a negative feedback circuit comprising a phase detector (PD)

1081, a loop filter (LPF) 1082, a voltage-controlled oscillator (VCO) 1083 having a frequency modulation function, and a programmable counter (PC) 1084.

The phase detector 1081 compares phases of a reference signal Sr and a division signal $S_{dv}$ from the programmable counter 1084 and outputs a signal S1081 in accordance with the difference to the loop filter 1082.

The loop filter 1082 generates a control voltage Vc of the voltage-controlled oscillator 1083 in accordance with the signal S1081 and outputs it to the voltage-controlled oscillator 1083.

The VCO 1083 includes a digital/analog converter (DAC) 1085, oscillates by modulating a frequency in accordance with the control voltage $V_c$ of the loop filter 1082 using a modulation rate given as an analog value from the DAC 1085 to generate a clock signal $CLK_{opm}$ having a frequency of $f_{opm}$ and outputs it to the laser source 101 and the programmable counter 1084.

The programmable counter 1084 divides the frequency $f_{opm}$ of the output modulated clock signal $CLK_{opm}$ of the VCO 1083 exactly by N (here, N=24) and outputs a division signal $S_{dv}$ having a frequency of $f_{opm}/N$ to the phase detector 1081.

Next, a VCO embodying the variable frequency oscillator according to the present invention will be explained in further detail.

Figure 8:
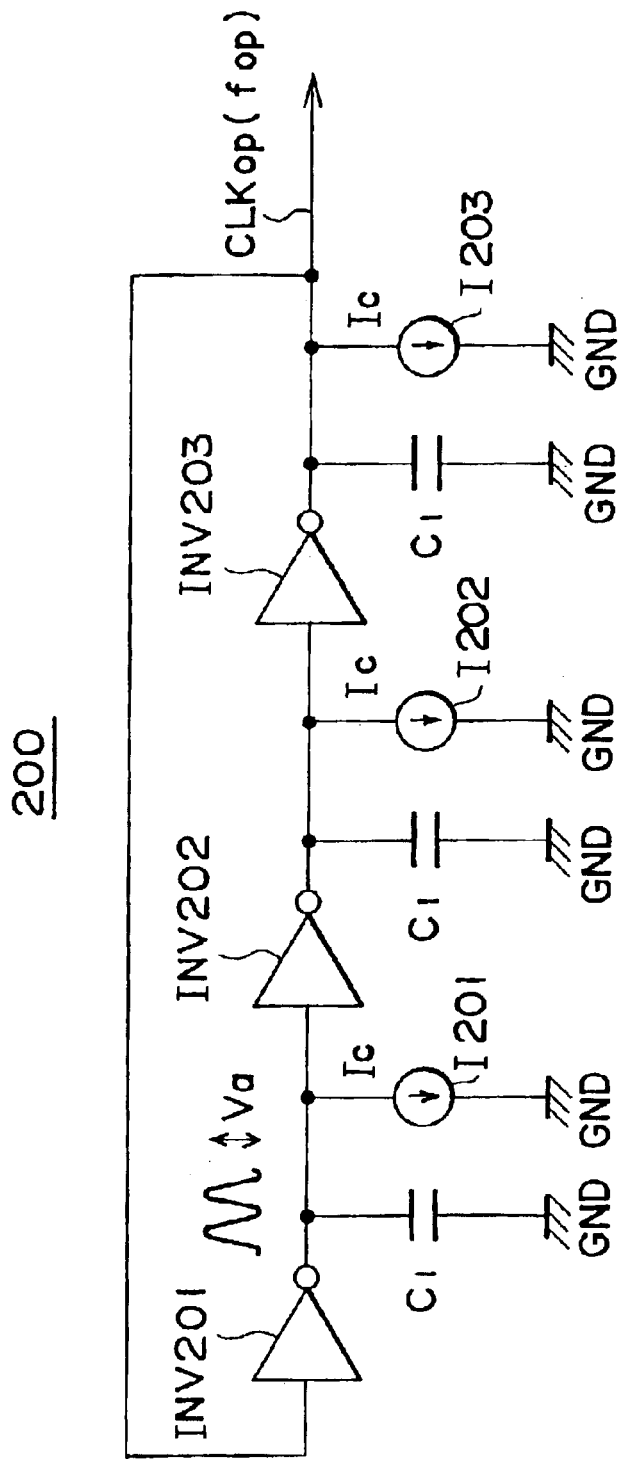
FIG. 8 is a view of a ring oscillator as a general type of variable frequency oscillator.

As a general variable frequency oscillator, there is a ring oscillator shown in FIG. 8.

The ring oscillator 200 comprises, as shown in FIG. 8, a plurality of (three in FIG. 8) inverters INV201 to INV203 connected in cascade in a ring and current sources I201 to I203.

An oscillation frequency of the ring oscillator 200 is determined by three parameters Va, Cl, and $I_c$, which are an output amplitude Va of the inverters, a load capacity Cl added to an output of the inverters, and a! control current IC.

The frequency $f_{op}$ of an output clock $CLK_{op}$ is determined by the number of inverter stages, but there is a relationship indicated by the next formula (1):

$$f_{op} \propto I_c/C_l V_a \qquad (1)$$

This variable frequency oscillator is called a current-controlled oscillator (ICO) when receiving the control current $I_c$ as a direct input, while is called a voltage-controlled oscillator (VCO) when receiving the control voltage Vc as input and controlling the $I_c$. For example, in a VCO, the control voltage $V_c$ controls an output frequency $f_{op}$.

Figure 9:
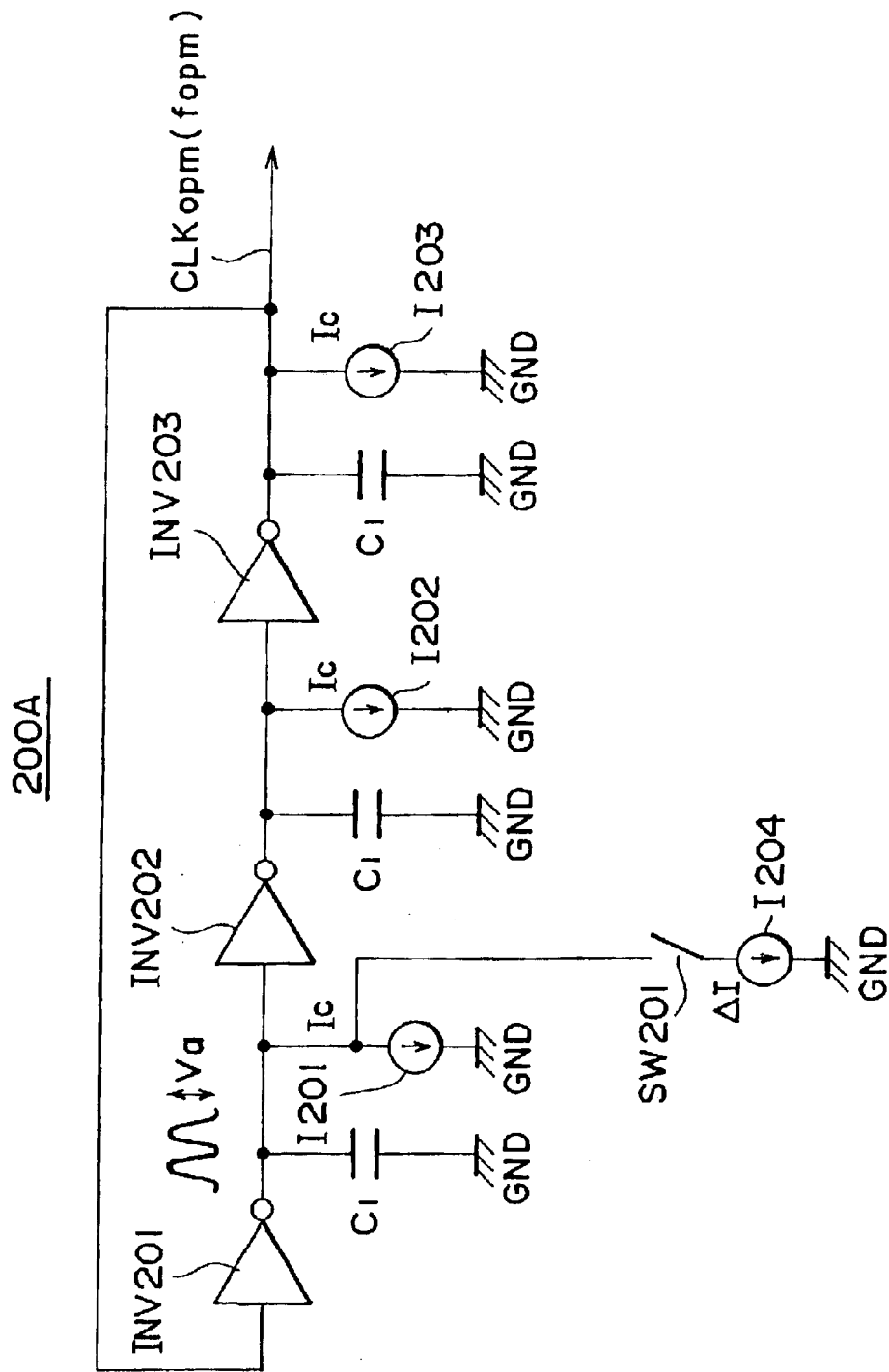
FIG. 9 is a view for explaining the configuration of a voltage-controlled oscillator configured to add a current according to the present invention.

Consider the case where, independent from the control current $I_c$ determined by the control voltage $V_c$, as shown in FIG. 9, an additional current $\Delta I$ from a current source I204 proportional to $\Delta I_c$ is added via a switch 201 to where a control current flowing to the VCO 200A is $I_c$ and a modulated clock $CLK_{opm}$ output having a frequency of $f_{opm}$ is obtained.

In this case, in the same way as explained above, the frequency and C, V, and $I_c$ become the same as those in the above formula (1), so they have the following proportional relationship based on the above formula (1):

$$I_c:(I_c+\Delta I) \propto f_{op}:f_{opm}+\Delta f \qquad (2)$$

As explained above, by adding the fixed current $\Delta I$ to the control current $I_c$, it becomes possible to raise or lower the frequency of the output clock $CLK_{opm}$ as a whole compared with the $CLK_{op}$ in the case in FIG. 8.

The VCO 200A in FIG. 9 can be used as the VCO 1083 of the present embodiment.

In this case, the output clock $CLK_{opm}$ is increased or decreased by a constant frequency ratio.

When the additional current $\Delta I$ may be obtained as a positive or negative value, it can be used for increasing the frequency or decreasing the frequency, respectively.

Figure 10:
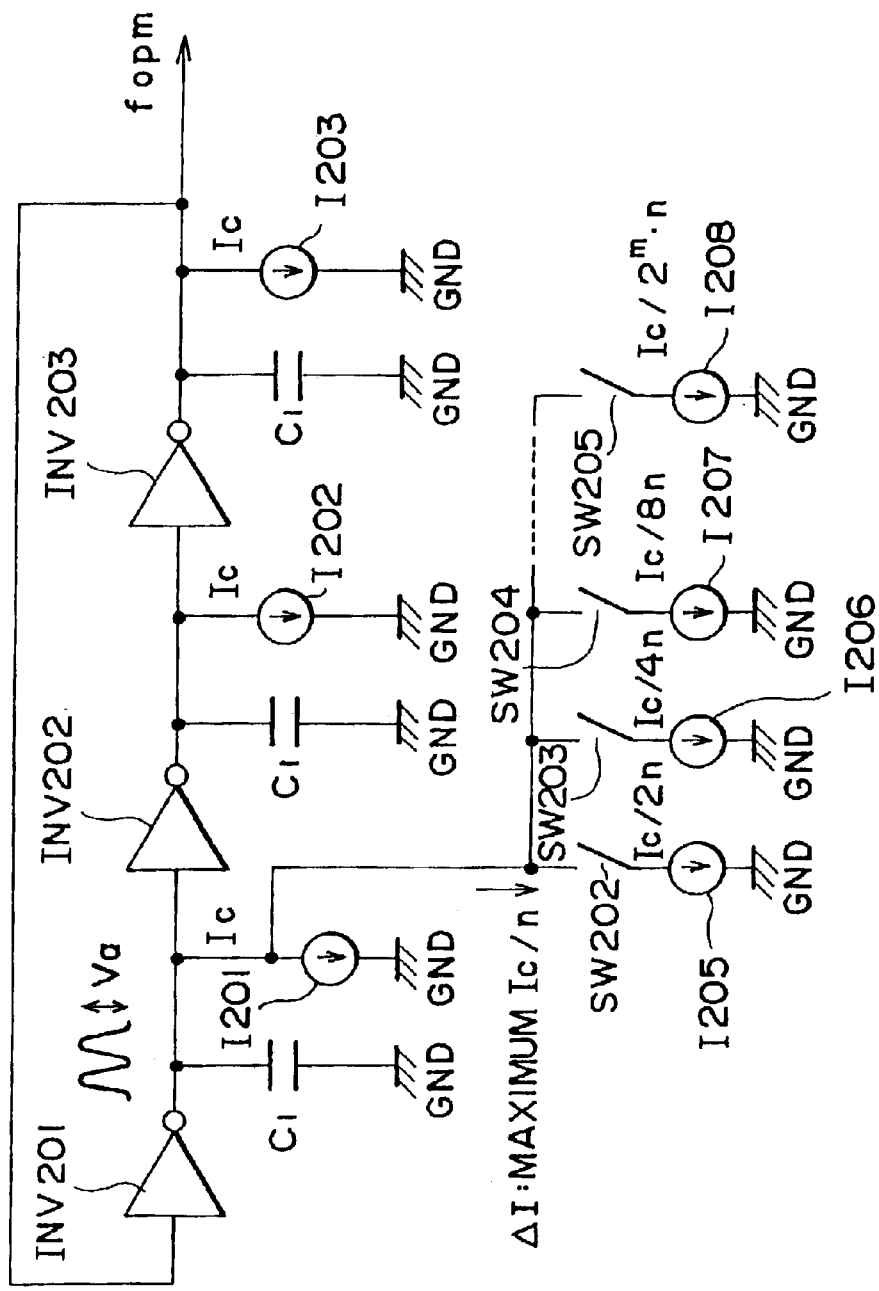
FIG. 10 is a view for explaining the configuration of a voltage-controlled oscillator configured to add a weighted current according to the present invention.

For further improving controllability, in addition to adding the fixed current $\Delta I$ to the control current $I_c$, the VCO 1083 (200B) of the present embodiment may be configured as a DAC (digital/analog converter) as shown in FIG. 10 which divides the control current $I_c$ by n (n can be any number), weights the additional currents so as to give an m-bit variable range (1/2, 1/4, 1/8, ..., $1/2^m$), and switches the additional currents by switches SW 202 to 205.

In FIG. 10, I205 indicates a current source of an additional current $I_c/2n$, I206 is a current source of an additional current $I_c/4n$, I207 is a current source of an additional current $I_c/8n$, ..., I208 is a current source of an additional current $I_c/mn$, respectively.

In the VCO 200B, an additional current for an m-bit input digital code d input to the DAC 1085 is given by the following formula and a current $\Delta I$ of $I_c/n$ at maximum can be added.

$$\Delta I = I_c \cdot d/n 2^m \qquad (3)$$

When defining the modulation rate $\alpha=(\Delta f_{opm}-\Delta f_{op})/\Delta f_{op}$ of the frequency, the modulation rate $\alpha$ of the frequency does not depend on the oscillation frequency $f_{op}$ of the output clock signal and maintains the relationship below:

$$\alpha = kd \qquad (4)$$

Here, k is a coefficient for determining a modulation rate for the input code d. This is determined by a proportional relationship for obtaining an oscillation frequency $f_{op}$ found from the relationship of the above formula (1) and a current ratio n.

As explained above, the distinctive characteristic of the VCO 1083 according to the present embodiment is that the modulation rate of the frequency modulation can be expressed by a digital code d input to the DAC.

When preparing a modulation pattern in synchronization with a reference signal, a PLL circuit synchronized with the reference signal and having frequency modulation characteristics can be attained.

Figure 2:
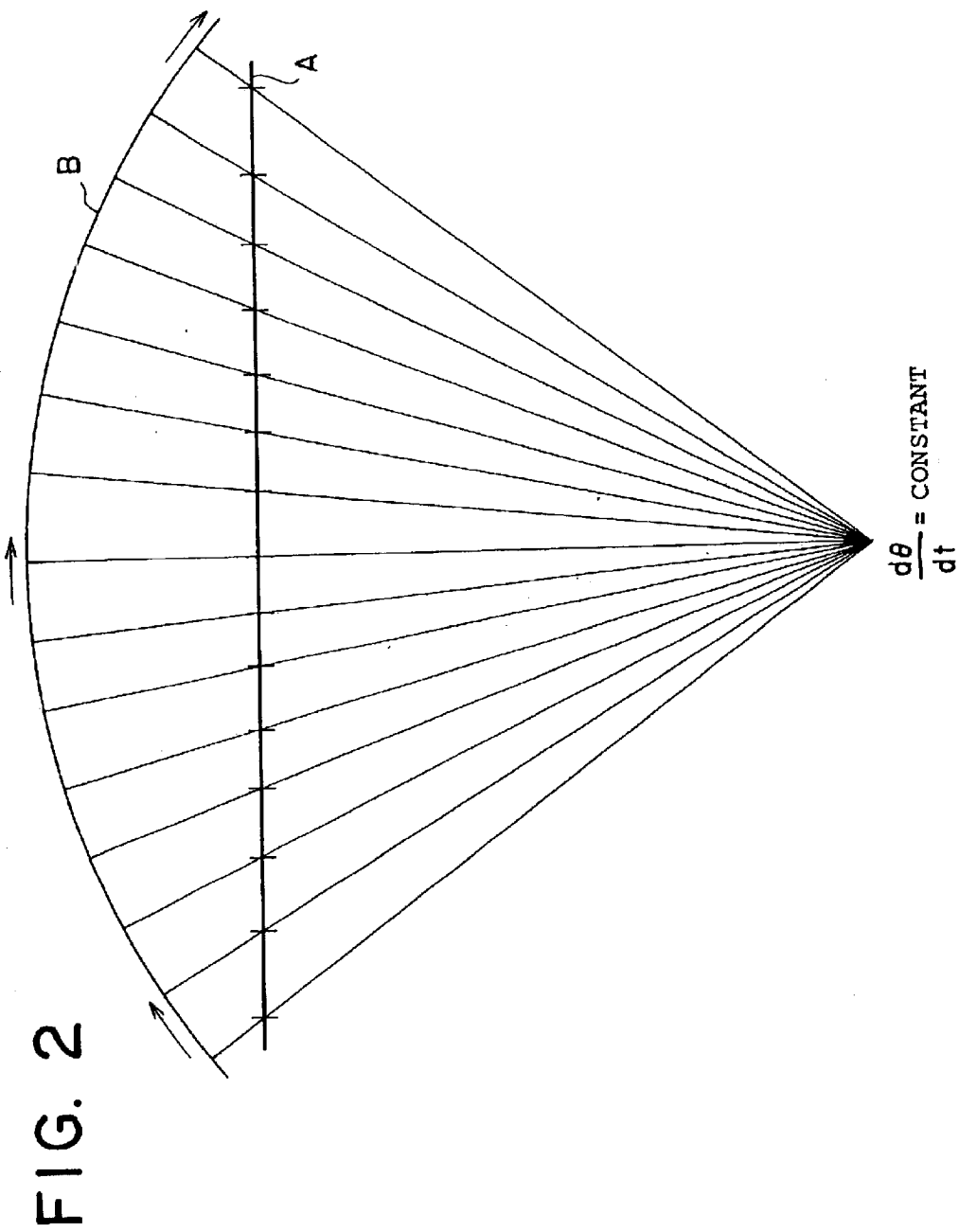
FIG. 2 is a schematic view of the path of a laser beam reflected by a polygon mirror and scanning a circumference in the laser beam printer.

When the angular velocity changes in FIG. 2, the cycle of the synchronization signal changes, however, in the present embodiment, the modulation of the VCO changes in accordance not with the oscillation frequency but with its ratio, so it is not necessary to separately prepare a modulation pattern corresponding to the clock frequency.

As a result, in the present embodiment, when modulating the frequency by configuring a PLL circuit 108A as shown in FIG. 7 using a VCO having a frequency modulation DAC in FIG. 10, when inputting a digital signal DGT for modulation synchronized with the reference signal Sr by changing the digital code for modulation within a cyclic period of the reference signal, a stable lock state can be attained in the PLL mechanism regardless of the average value of control codes.

Figure 3:
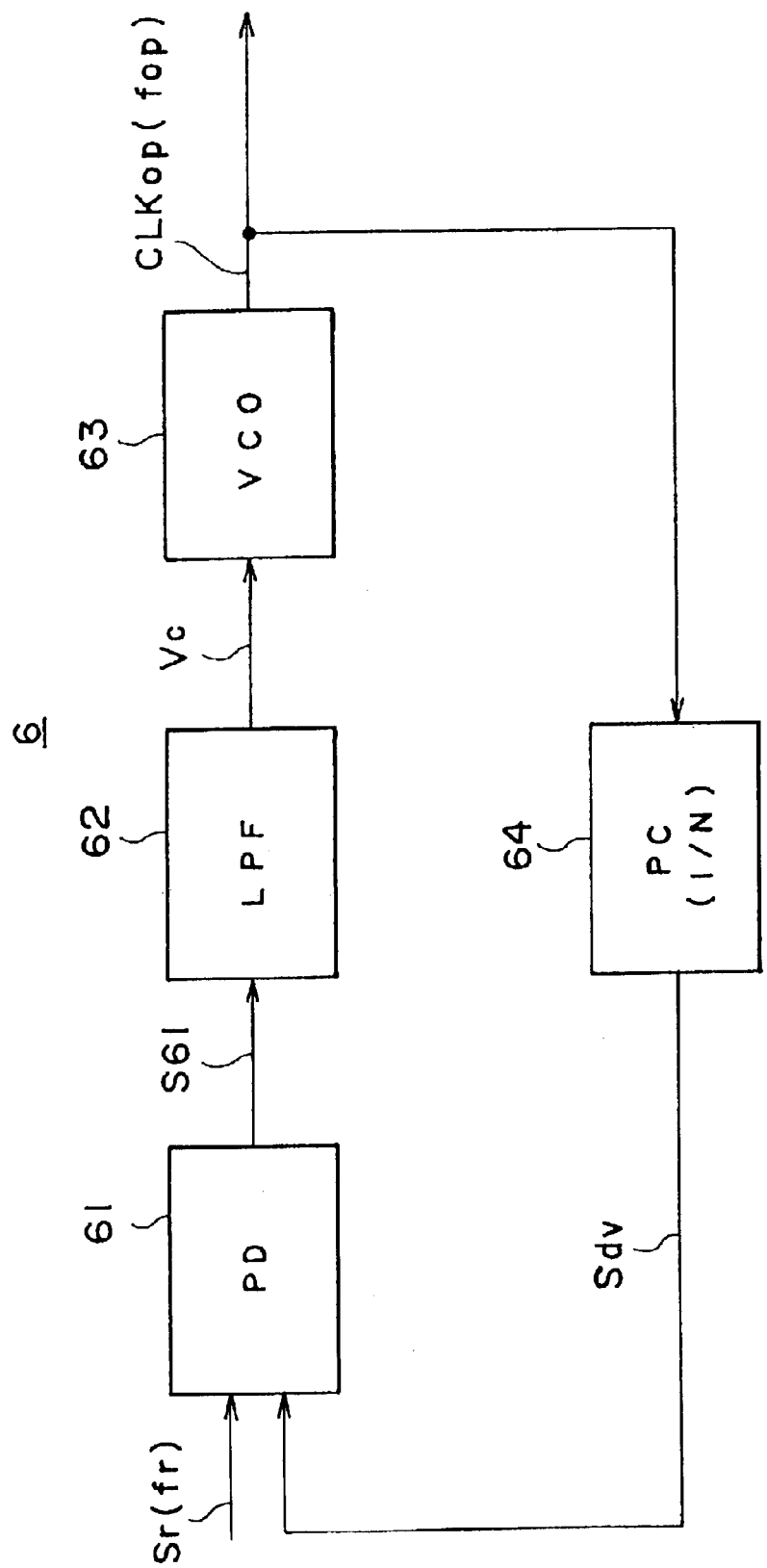
FIG. 3 is a block diagram of an example of the configuration of a general PLL circuit used in a clock control system of a laser source of the laser beam printer of FIG. 1.
Figure 4:
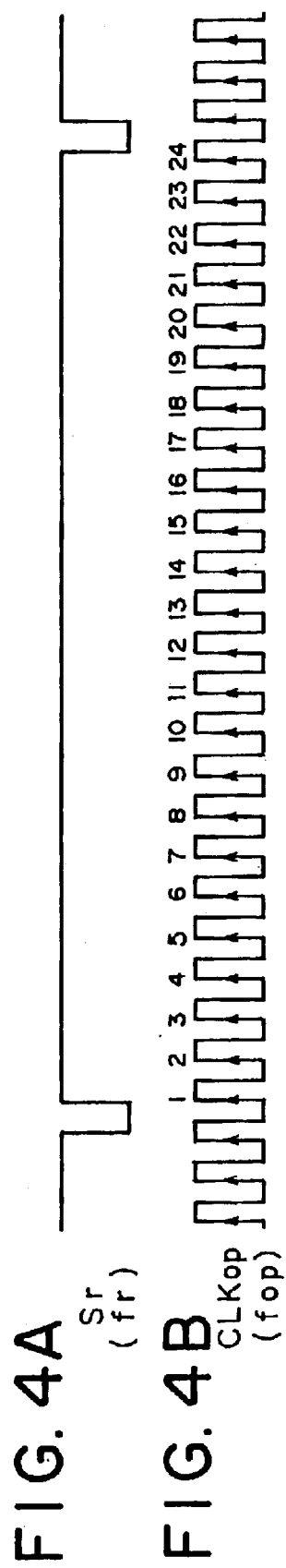
Figure 5:
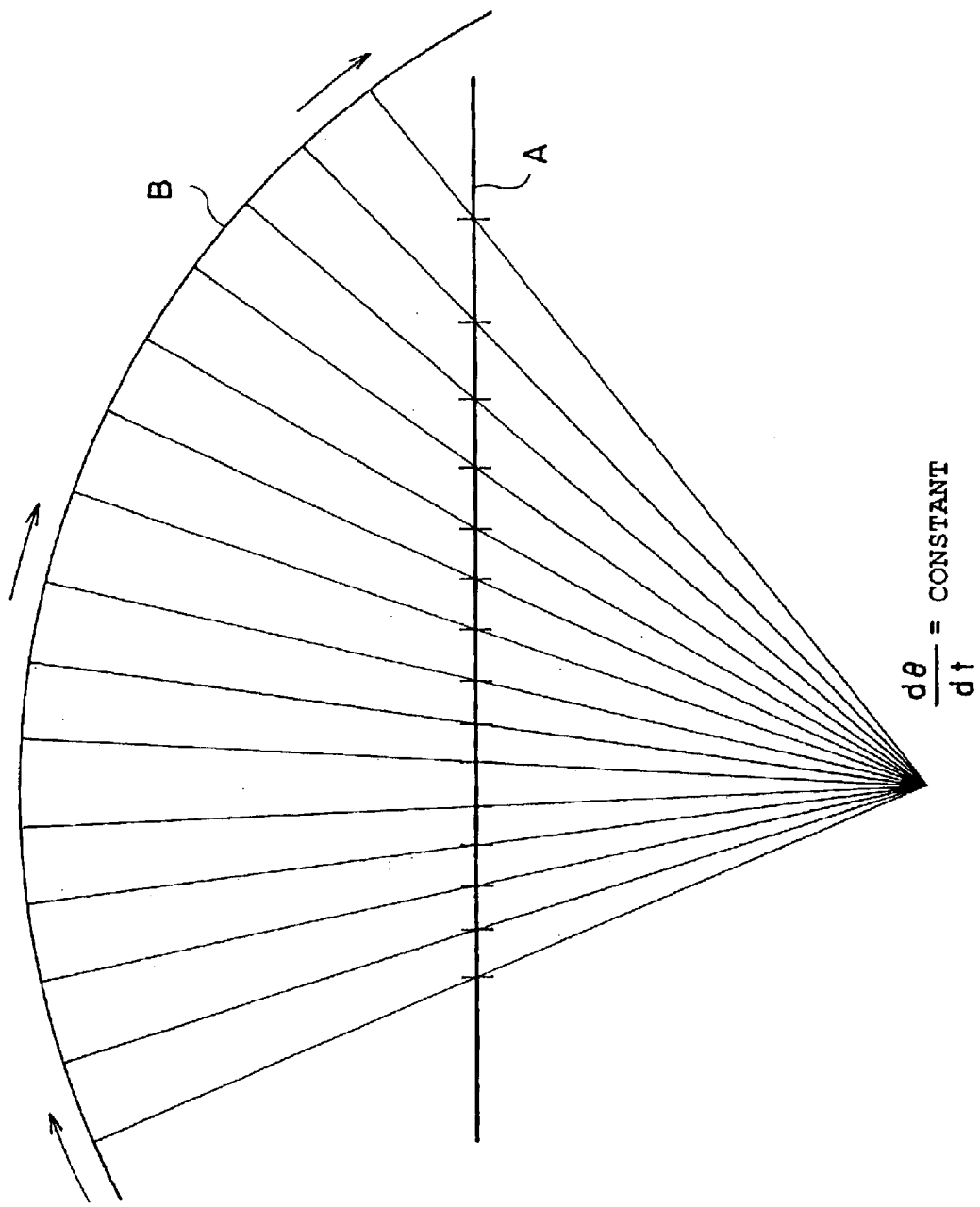
FIG. 5 is a view for explaining position deviation of an optical system in a laser beam printer.
Figure 11:
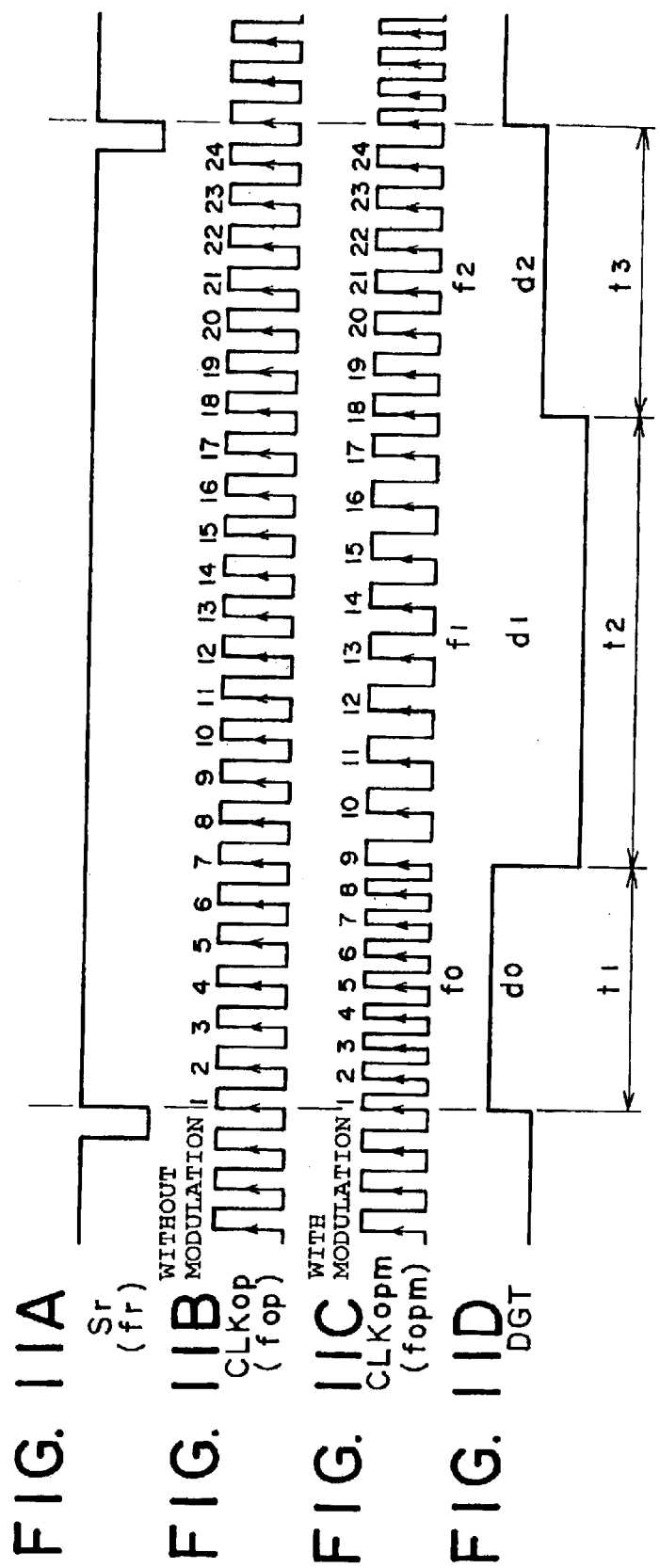
FIG. 11A is a timing chart of a reference signal Sr given to a PLL circuit.
FIG. 11B is a timing chart of an output clock signal $CLK_{op}$ of the PLL circuit in FIG. 3 not having a modulation function.
FIG. 11C is a timing chart of an output clock signal $CLK_{opm}$ when modulated by the PLL circuit in FIG. 7.
FIG. 11D is a timing chart of a digital signal DGT for modulation of the voltage-controlled oscillator.

FIG. 11A is a timing chart of a reference signal Sr supplied to a PLL circuit, FIG. 11B is a timing chart of an output clock $CLK_{op}$ of the PLL circuit not having a modulation function in FIG. 3, FIG. 11C is a timing chart of an output clock $CLK_{opm}$ modulated by the PLL circuit in FIG. 7, and FIG. 11D is a timing chart of a digital signal DGT for modulation of the VCO.

Namely, FIG. 11A and FIG. 11B show the relationship of a reference signal $S_r$ and a synchronization clock when a PLL circuit is configured by using a normal VCO.

Figure 1:
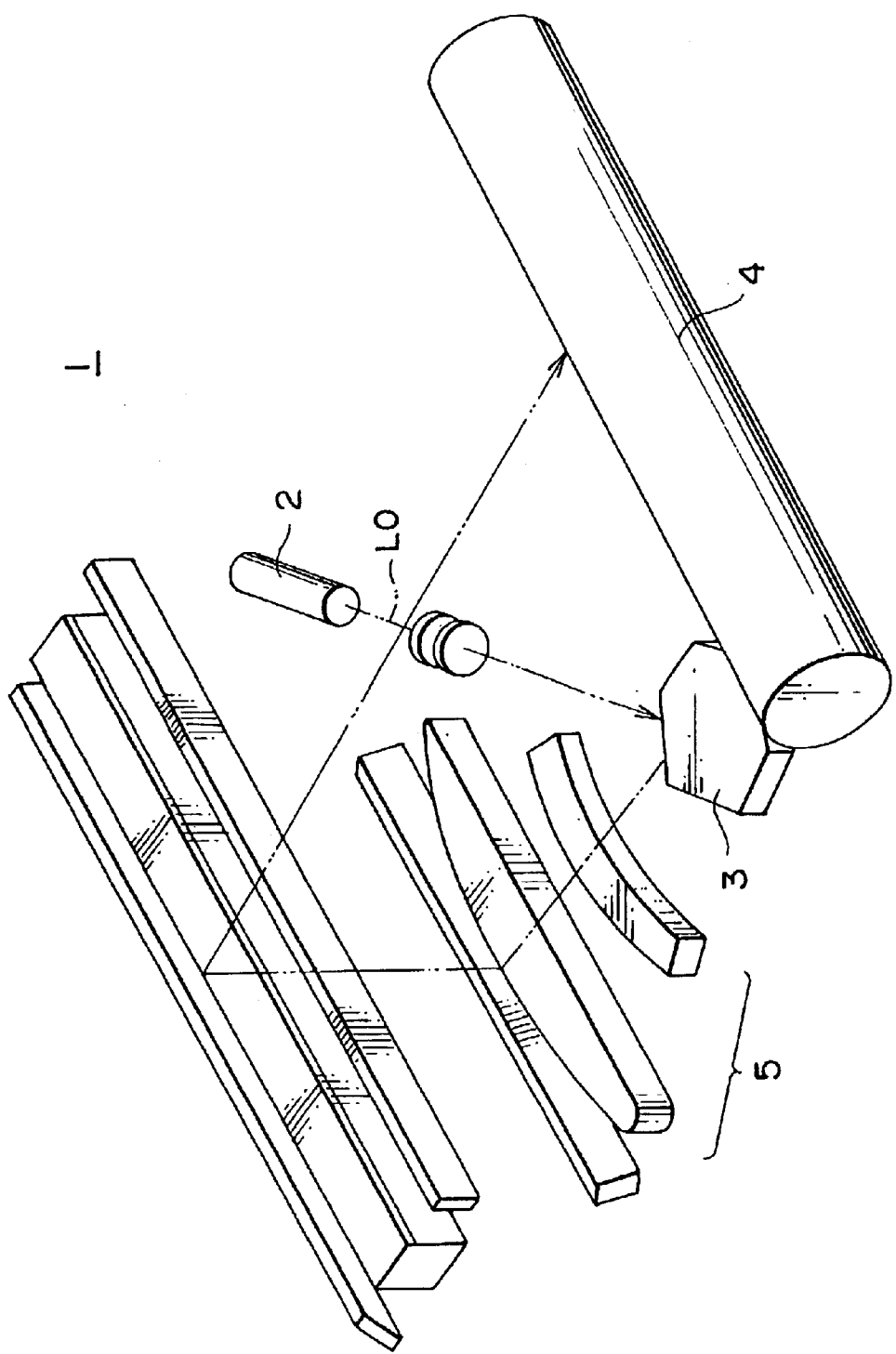
FIG. 1 is a view of an example of the general configuration of a laser beam printer.

Also, FIG. 11A, FIG. 1C, and FIG. 11D show the relationship of a reference signal $S_r$, digital input signal, and a modulated output clock $CLK_{opm}$ when inputting a digital signal DGT for modulation of the VCO by using a VCO 200B having a modulation DAC as shown in FIG. 10.

In any case, the total number of synchronization clocks in the reference signal is 24. This is identical with the value of the programmable counter (PC) N=24.

In the present embodiment, as shown in FIG. 1D, the digital signal DGT for modulation of the VCO changes in frequency to three stages in 8 clock intervals in a synchronization period of the reference signal $S_r$.

In the present embodiment, specifically, one scanning period is divided into three periods, the largest first digital value d0 is given to the first period t1 (from start of scanning to elapse of predetermined time), a smallest second digital value d1 is given to the second period t2 (approximately center period of the scanning period) continuing from the first period t1, and a median value d2 of the first and second digital values is given to the third period t3 (until end of scanning period) continuing from the second period t2.

The modulation degree (rate) in the VCO 1083 becomes larger as the value of the modulation digital signal DGT given becomes larger as will be understood from FIG. 11C.

Namely, the VCO 1083 according to the present embodiment is capable of modulating the oscillation frequency in synchronization with a reference signal.

Note that in the present embodiment, a signal obtained by dividing a multiplication clock modulated in synchronization with a reference signal obtained by the PLL circuit by the multiple is completely synchronized with the reference signal due to the PLL operation.

Next, the operation of the above configuration will be explained with reference to FIG. 11A, FIG. 11C, FIG. 11D, and FIG. 12.

Figure 12:
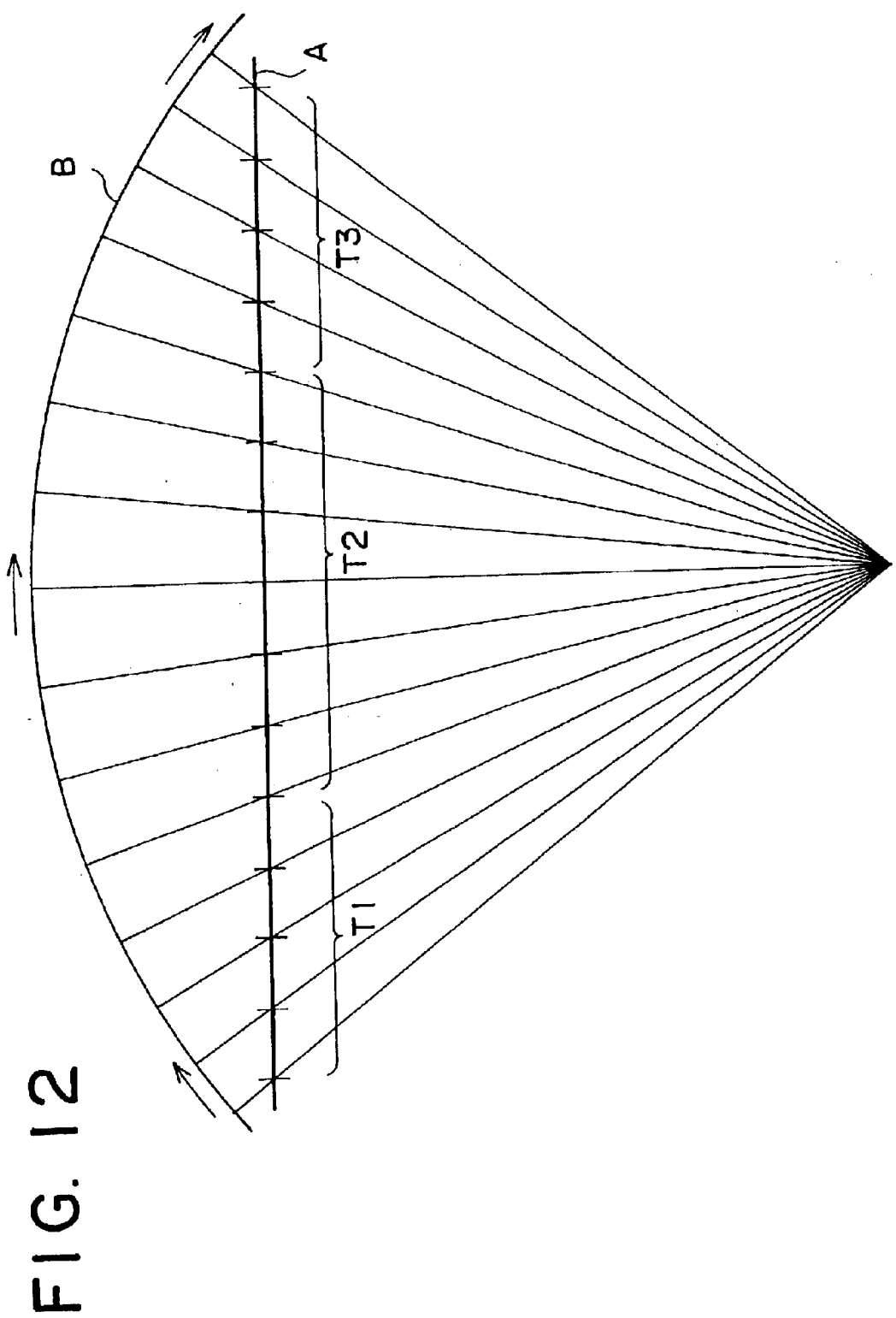
FIG. 12 is a schematic view of the path of a laser beam reflected by a polygon mirror and scanning a circumference in the laser beam printer in FIG. 6.

Note that FIG. 12 is a schematic view of the path of a laser beam reflected on a polygon mirror and scanned on a circumference in the laser beam printer of FIG. 6.

First, the largest first digital value d0 is given as a modulation digital signal DGT during the first period t1 to the DAC 1085 of the VCO 1083 of the PLL circuit 108A constituting the clock supply circuit 108.

In the PLL circuit 108A, the phases of the reference signal Sr and a division signal $S_{dv}$ from the programmable counter 1084 are compared by the phase detector 1081 and a signal S1081 in accordance with the difference is output to the loop filter 1082.

In the loop filter 1082, a control voltage $V_c$ of the VCO 1083 in accordance with the signal S1081 from the phase detector 1081 is generated and it is output to the VCO 1083.

In the VCO 1083, the frequency is modulated by using a modulation rate given as an analog value from the DAC 1085 and the VCO starts oscillation at a modulation frequency f0 in accordance with the control voltage $V_c$ from the loop filter 1082 as shown in FIG. 1C. Then, a clock signal $CLK_{opm}$ having the frequency f0 ($f_{op}$) is generated and it is output to the laser source 101 and the programmable counter 1084.

Also, in the programmable counter 1084, the frequency $f_{opm}$ of the output modulation clock signal $CLK_{opm}$ of the VCO 1083 is divided exactly by N and a division signal $S_{dv}$ having a frequency of $f_{opm}/N$ is output to the phase detector 1081.

In the laser source 101 receiving the clock signal $CLK_{opm}$ having a modulated frequency f0, a laser beam L0 is subjected to a predetermined modulation operation in synchronization with the clock signal $CLK_{opm}$ and emitted. The laser beam L0 from the laser source 101, as shown in FIG. 6, is converted to parallel light by the collimeter lens 102, then converged on the cylindrical lens 103 and focused on a light reflection facet of the polygon mirror 104.

In the polygon mirror 104, the laser beam from the cylindrical lens 103 is reflected at its light reflection facet 1041 to an opposite direction of the arranged position of the photosensitive drum 107. As a result, the laser beam L0 from the laser source 101 is scanned in a predetermined range by the polygon mirror 104 rotating at a predetermined speed and the fθ lens 105 and irradiated on a predetermined region from one end portion on the photosensitive drum 107 via the reflection optical system 106.

In this case, the laser beam is scanned over the range indicated by T1 shown in FIG. 12.

Next, the smallest second digital value d1 is given as a modulation digital signal DGT during the second period t2 to the DAC 1085 of the VCO 1083 of the PLL circuit 108A constituting the clock supply circuit 108.

In the VCO 1083 of the PLL circuit, the frequency is modulated by a modulation rate given as an analog value from the DAC 1085 and, as shown in FIG. 1C, the VCO starts oscillation at a lower modulation frequency f1 than f0 corresponding to the control voltage $V_c$ from the loop filter 1082. Then, a clock signal $CLK_{opm}$ having the low frequency f1 ($f_{opm}$) is generated and it is output to the laser source 101 and the programmable counter 1084.

In the laser source 101 receiving the clock signal $CLK_{opm}$ having a modulated frequency f1, a laser beam L0 is subjected to a predetermined modulation operation in synchronization with the clock signal $CLK_{opm}$ and emitted. The laser beam L0 from the laser source 101 is converted to parallel light by the collimeter lens 102, converged by the cylindrical lens 103, and focused on the light reflection facet of the polygon mirror 104.

In the polygon mirror 104, the laser beam form the cylindrical lens 103 is reflected at the light reflection facet 1041 to an opposite direction of the arranged position of the photosensitive drum 107. As a result, the laser beam L0 from the laser source 101 is scanned in a predetermined range by the polygon mirror 104 rotating at a predetermined speed and the fθ lens 105 and irradiated on an approximately center region on the photosensitive drum 107 via the reflection optical system 106.

In this case, the laser beam is scanned over a range indicated by T2 shown in FIG. 12.

Next, a median third digital value d2 is given as a modulation digital signal DGT during the third period t3 to the DAC 1085 of the VCO 1083 of the PLL circuit 108A constituting the clock supply circuit 108.

In the VCO 1083 of the PLL circuit, the frequency is modulated by a modulation rate given as an analog value from the DAC 1085 and, as shown in FIG. 11C, the VCO starts oscillation at a higher modulation frequency f2 than f1 corresponding to a control voltage Vc from the loop filter 1082. Then, a clock signal $CLK_{opm}$ having the frequency f2 ($f_{opm}$) is generated and it is output to the laser source 101 and the programmable counter 1084.

In the laser source 101 receiving the clock signal $CLK_{opm}$ having the modulated frequency f2, a laser beam L0 is subjected to a predetermined modulation operation in synchronization with the clock signal $CLK_{opm}$ and emitted. The laser beam L0 from the laser source 101 is converted to parallel light by the collimeter lens 102, converged by the cylindrical lens 103, and focused on the light reflection facet of the polygon mirror 104.

In the polygon mirror 104, the laser beam from the cylindrical lens 103 is reflected at the light reflection facet 1041 to an opposite direction of the arranged position of the photosensitive drum 107. As a result, the laser beam L0 from the laser source 101 is scanned in a predetermined range by the polygon mirror 104 rotating at a predetermined speed and the fθ lens 105 and irradiate on the rest of the other end portion on the photosensitive drum 107 via the reflection optical system 106.

In this case, the laser beam is scanned over a range indicated by T3 shown in FIG. 12.

As explained above, according to the present invention, by configuring a PLL circuit by using the VCO 1083 including a DAC 1085, starting oscillation after modulating the frequency by a modulation rate given as an analog value from the DAC 1085 in accordance with a control voltage $V_c$ from the loop filter 1082, and generating a clock signal $CLK_{opm}$ of the frequency $f_{opm}$ and supplying it to the laser source 101, a variable frequency oscillator capable of modulating a clock cycle digitally can be easily configured and frequency modulation in the synchronization period can be easily performed while maintaining PLL synchronization.

Furthermore, since the VCO is controlled by voltage, which is an analog amount, a DAC is necessary for digital control by software from the outside, however, in the present embodiment, the DAC is built into the VCO. The modulation amount can therefore be handled as a digital value as it is. It is also possible to give the DAC a modulation function and an oscillation frequency proportional function.

Note that in the present embodiment, while a laser beam printer was explained as an example, it is clear that the present invention is not limited to this and can be used in any applications which require frequency modulation. As usages other than a laser printer, for example, a digital copy machine, a video apparatus wherein an electron gun is horizontally scanned, a liquid crystal projector, etc. may be mentioned.

Also, the above embodiment was configured to modulate the oscillation frequency of the VCO by controlling the modulation degree by a digital value via the DAC, but it can also be configured in other manners.

Figure 13:
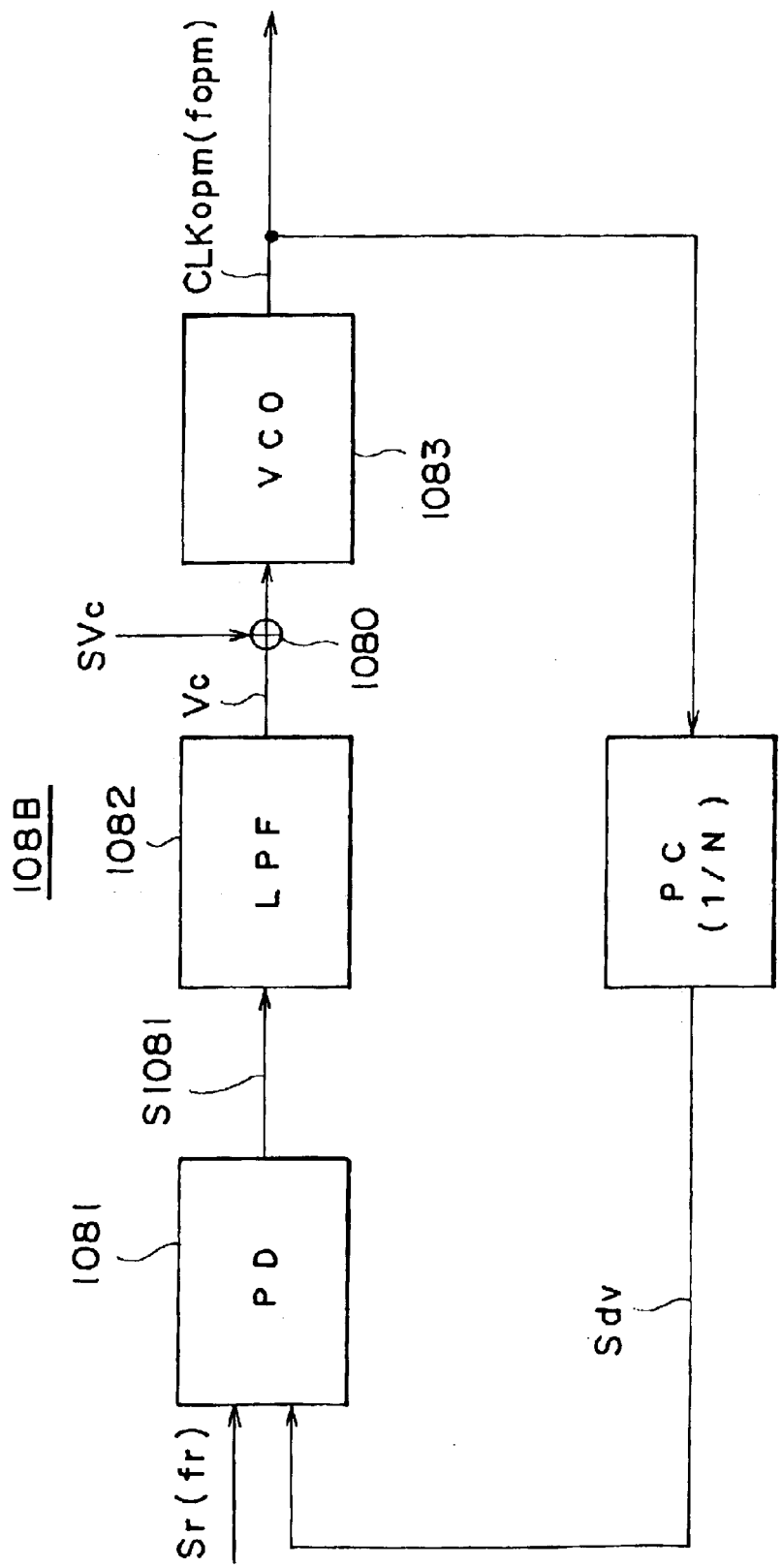
FIG. 13 is a block diagram of another example of the configuration of a PLL circuit having a modulation function.

To modulate the oscillation frequency in the synchronization period of the PLL circuit 108B by another configuration, for example as shown in FIG. 13, it is possible to provide a new input path for adding a control voltage signal $SV_c$ for modulation and a circuit 1086 for generating the additional signal to an input system of the control voltage $V_c$ of the VCO 1083.

Note that in the PLL circuit 108B, since the absolute value of the change of the control voltage Vc becomes the absolute value of change of the oscillation frequency as it is, the higher the oscillation frequency of the VCO 1083, the smaller the change appears to be, while the lower the oscillation frequency, conversely the large the change appears to be.

As a result, to maintain the ratio constant, it is preferable to provide a circuit for controlling the changing voltage in accordance with the control voltage $V_c$.

Note that the embodiments explained above were described to facilitate the understanding of the present invention and not to limit the present invention. Accordingly, elements disclosed in the above embodiments include all design modifications and equivalents belonging to the technical field of the present invention.

What is claimed is:

1. An oscillator for oscillating at a frequency based on a control signal, comprising a modulation means for modulating a frequency by adding a modulation signal to the control signal.

2. An oscillator as set forth in claim 1, wherein a modulation rate of the modulation means is controlled by a ratio of an oscillation frequency to the modulation signal value.

3. An oscillator as set forth in claim 2, wherein the modulation signal value is given digitally.

4. An oscillator as set forth in claim 1, wherein the oscillator forms a ring-type oscillator including a plurality of delay stages controlled in delay value by an inverter or buffer and a control signal connected in cascade and forming a closed loop by an inverted phase and comprises a modulation means for modulating an oscillation frequency by adding a modulation signal to the control signal in part of the plurality of delay stages.

5. An oscillator as set forth in claim 4, wherein the modulation rate of the modulation means is controlled by a ratio of an oscillation frequency to the modulation signal value.

6. An oscillator as set forth in claim 5, wherein the modulation signal value makes the control signal value 1/n and furthermore is weighted so as to have a variable range of m bits.

7. A PLL circuit comprising:

a phase detector for comparing phases of a feedback signal of an output signal and a reference signal and outputting a signal indicating a phase difference;

a loop filter for receiving an output signal of the phase detector and outputting a control signal for canceling out the phase difference; and an oscillator for oscillating at a frequency based on a control signal from the loop filter;

the oscillator comprising a modulation means for modulating a frequency by adding a modulation signal to the control signal.

8. A PLL circuit as set forth in claim 7, wherein the modulation rate of the modulation means is controlled by a ratio of an oscillation frequency to the modulation signal value.

9. A PLL circuit as set forth in claim 8, wherein the modulation signal value is given digitally.

10. A PLL circuit as set forth in claim 7, wherein in the oscillator, a second control signal is controlled by a control signal of the loop filter and the frequency is controlled by the second control signal.

11. A PLL circuit as set forth in claim 7, wherein the oscillator forms a ring-type including a plurality of delay stages controlled in delay value by an inverter or buffer and a control signal connected in cascade and forming a closed loop by an inverted phase and comprises a modulation means for modulating an oscillation frequency by adding a modulation signal to the control signal in part of the plurality of delay stages.

12. A PLL circuit as set forth in claim 11, wherein the modulation rate of the modulation means is controlled by a ratio of an oscillation frequency to the modulation signal value.

13. A PLL circuit as set forth in claim 12, wherein the modulation signal value makes the control signal value 1/n and furthermore is weighted so as to have a variable range of m bits.

14. A PLL circuit as set forth in claim 11, wherein in the oscillator a second control signal is controlled by a control signal of the loop filter and the frequency is controlled by the second control signal.

* * * * *